United States Patent [19]

Ke

[11] Patent Number: 5,841,788
[45] Date of Patent: *Nov. 24, 1998

[54] METHODS FOR BACKPLANE INTERCONNECT TESTING

[75] Inventor: Wuudiann Ke, Lawrenceville, N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 733,592

[22] Filed: Oct. 18, 1996

[51] Int. Cl.$^6$ .................................................. G01R 31/28
[52] U.S. Cl. ........................................ 371/22.3; 324/158.1
[58] Field of Search ................................. 371/22.3, 21.1, 371/24, 25.1; 324/158.1, 73.1

[56] References Cited

U.S. PATENT DOCUMENTS

| | | | |
|---|---|---|---|
| 4,963,824 | 10/1990 | Hsieh et al. | 324/158 R |
| 5,047,708 | 9/1991 | Kondner, Jr. | 324/73.1 |
| 5,132,635 | 7/1992 | Kennedy | 324/158 R |
| 5,448,166 | 9/1995 | Parker et al. | 324/158.1 |
| 5,513,190 | 4/1996 | Johnson et al. | 371/22.5 |
| 5,574,730 | 11/1996 | End, III et al. | 371/22.1 |
| 5,581,742 | 12/1996 | Lin et al. | 371/21.1 |

OTHER PUBLICATIONS

"System Level Interconnect Test in a Tristate Environment," F.W. Angelotti et al., International Test Conference 1993, paper 2.4, pp. 45–53.

"A Proposed Method of Accessing 1149.1 in a Backplane Environment," L. Whetsel, Proceedings of International Test Conference, Sep. 20–24, 1992, pp. A–83 to A–93.

"A Secure Data Transmission Scheme for 1149.1 Backplane Test Bus," W. Ke et al., Proceedings of International Test Conference, Oct., 1995, pp. 789–796.

*Primary Examiner*—Hoa T. Nguyen

[57] ABSTRACT

A backplane testing method is provided in which test vectors are applied to individual circuit boards in a system while remaining circuit boards in the system are disabled. The signals on all receivers in the system are observed during testing. The circuit boards are connected to a test bus in a multi-drop arrangement, so that individual circuit boards can be addressed using slave interfaces. A walking enable technique is used to systematically toggle all of the drivers on the circuit boards. An intraboard testing technique is used for applying test vectors including an all 0's vector, an all 1's vector, and a series of test vectors generated from a binary counting sequence. Backplane faults are identified by comparing the observed receiver signals to the signals expected in response to the applied test vectors.

7 Claims, 8 Drawing Sheets

FIG. 2

|  | | UPDATE<br>BOARD 1 | UPDATE<br>BOARD 2 | UPDATE<br>BOARD 3 | UPDATE |
|---|---|---|---|---|---|
| BOARD 1 | 010001 | 110011 | 110011 | 110011 | 110011 |
| BOARD 2 | 111100 | 111100 | 001100 | 001100 | 001100 |
| BOARD 3 | 110110 | 110110 | 110110 | 001010 | 001010 |
| BOARD 4 | 000011 | 000011 | 000011 | 000011 | 110011 |
|  | CURRENT<br>VECTOR | INTERMEDIATE VECTORS<br>SAFE? | | | NEXT<br>VECTOR |

SIMPLE NET

3-STATE NET

WIRED-AND NET

WIRED-OR NET

DISABLE STATE

TOGGLING $d_1$

STUCK FAULT

SHORT FAULT

METHODS FOR BACKPLANE INTERCONNECT TESTING

BACKGROUND OF THE INVENTION

This invention relates to techniques for testing electronic systems. More particularly, this invention relates to methods for testing backplane interconnects using boundary scan techniques.

Boundary scan techniques are widely used for testing board interconnects. To be capable of being boundary scan tested, circuits must be provided with a chain of boundary scan cells into which test data can be loaded. The boundary scan cells are provided with test data by serially loading the boundary scan chain with a test vector. Once the boundary scan cells have been loaded, the outputs of the cells are used to apply the test vector to the circuit being tested.

Boundary scan techniques have been successfully implemented for testing individual integrated circuits and for testing circuit boards. However, there are a number of difficulties associated with using boundary scan techniques for testing backplanes.

Backplanes have slot connectors into which the edge connectors of circuit boards are inserted and have interconnects for providing communication pathways between boards. Backplane testing involves testing the interconnects to ensure that the assembled backplane is functioning properly. Faults can arise due to misplugged boards, bent, broken or shorted board pins, or interconnect traces on the backplane that are open or shorted. Testing while the boards are inserted into the backplane is required to detect these various faults.

One possible technique for boundary scan testing of backplanes is to link the boundary scan cells on each board together, to create a single long scan chain. However, this technique is only suitable for small static systems. If a system is dynamically configurable, the position of boards on the backplane can change and boards can be removed or added. These conditions would interrupt a single long scan chain.

Individual circuit boards can be tested using a multi-drop test bus configuration, in which multiple boards are connected to a common test bus. Each board is provided with a slave interface that monitors communications from a bus master. With this configuration, boards can be individually addressed for testing. However, multi-drop configurations have not been used for testing backplanes.

One difficulty associated with the boundary scan testing of backplanes is the large quantity of data that must be handled because multiple boards are involved. Each board has approximately 10–100 components, and approximately 10–100 boards may be mounted on a given backplane. Performing a boundary scan test of the backplane using existing methods requires the processing of boundary scan description language and hierarchical description language files that define the boundary scan cells. These files contain data concerning the positions of each cell, the type of each cell (input, output, or control), and data describing the way in which the boundary scan cells are interconnected. Because the complexity of performing a test increases dramatically as the volume of this data increases, the need to handle these data files may make backplane testing for a given system impractical.

Further, most backplanes are dynamically reconfigurable. Various board types (e.g., memory, input/output, etc.) may be inserted into the backplane. The total number of boards may vary, and the boards may be inserted into the backplane in different orders. Because the type, number, and order of the boards in the backplane are not fixed, thousands or millions of different system configurations may be possible.

Another difficulty involved in boundary scan backplane testing arises from the inability to simultaneously change the test vectors on different boards. In a multi-drop configuration, each board is addressed individually. The test vector of an individual board is changed by addressing the board and loading a new test vector into the scan chain on that board. It is not possible, however, to change the test vectors for all boards at the same time. As a result, the process of replacing one set of test vectors with another may cause contention between circuit components on different boards, potentially damaging the components. Boundary scan testing in multi-drop configurations has therefore been limited to board-level, rather than backplane-level testing.

It is therefore an object of the present invention to provide methods for boundary scan backplane testing.

SUMMARY OF THE INVENTION

This and other objects of the invention are accomplished in accordance with the principles of the present invention by providing a backplane testing method in which test vectors are applied to circuit boards individually, while the remaining boards in the system are disabled, and in which the signals on all receivers in the system are observed after each test vector is applied.

Testing may be performed using a walking enable technique. The walking enable technique involves precomputing primitive test vectors. Disable vectors are used to disable the driver pins on the boards during testing to avoid contention between drivers that could damage circuit components. Enable 0 and enable 1 vectors are used to systematically toggle each driver in the system. As the drivers are toggled, the scan cells associated with the receivers on all boards of the system are observed. The behavior of the receivers in response to the test vectors applied to the drivers allows backplane faults to be detected and characterized.

Testing may also be performed using an intraboard counting technique. With the intraboard counting technique, an all0's vector, an all 1's vector, and a series of test vectors based on a binary counting sequence are applied to each circuit board. The intraboard counting technique is not as comprehensive as the walking enable technique in identifying faults. However, the intraboard counting technique allows testing to be completed more quickly than the walking enable technique.

Further features of the invention, its nature and various advantages will be more apparent from the accompanying drawings and the following detailed description of the preferred embodiments.

BRIEF DESCRIPTION OF THE DRAWINGS

FIG. 2 is a schematic diagram showing how a board-by-board update of test vectors can create contention on the backplane interconnects of the system of FIG. 1.

DETAILED DESCRIPTION OF THE PREFERRED EMBODIMENTS

Figure 1:
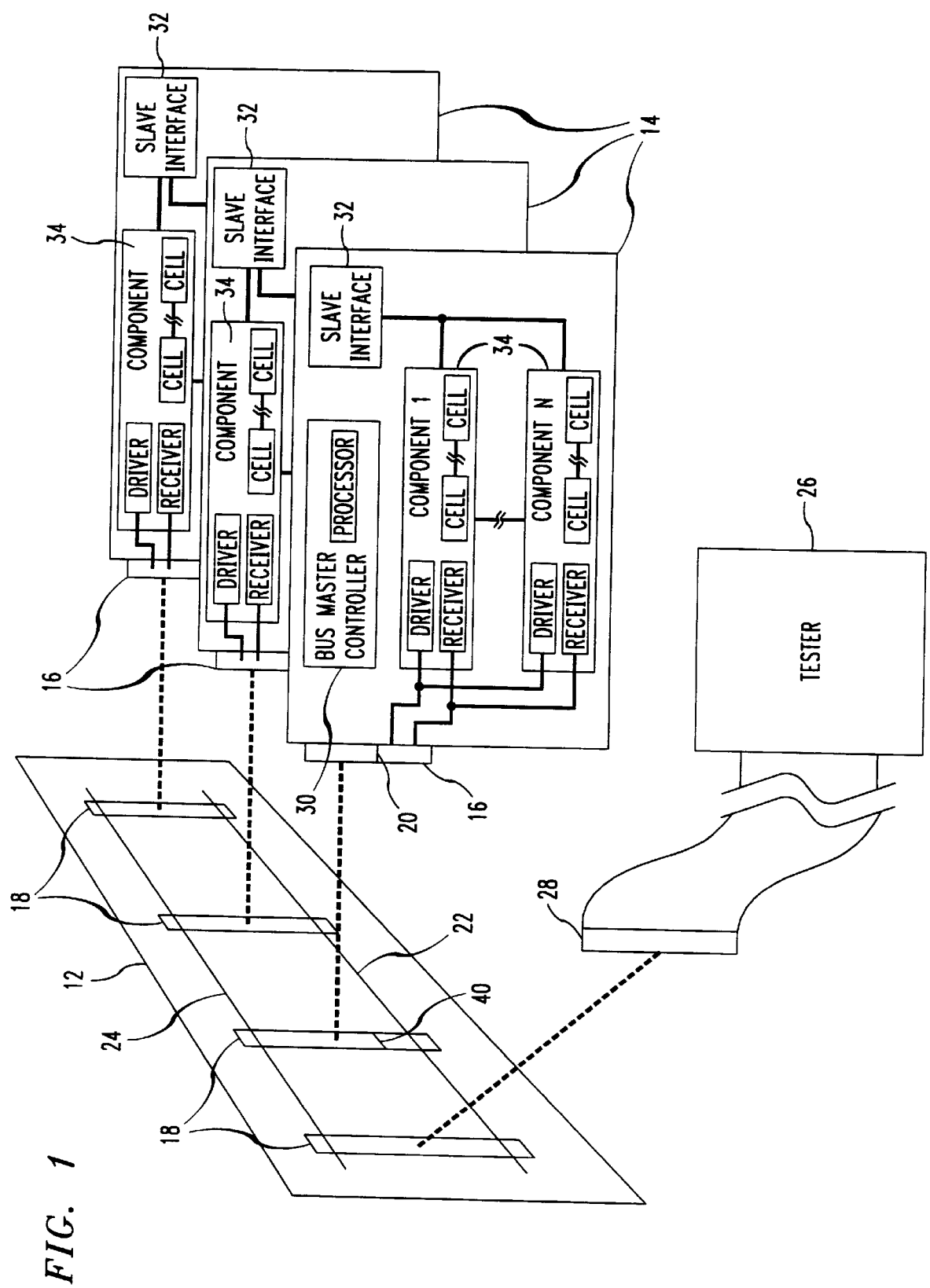
FIG. 1 is a perspective view of a multiboard electronic system having a backplane to be tested in accordance with the present invention.

Electrical system 10 is formed from backplane 12 and circuit boards 14, as shown in FIG. 1. In operation, boards 14 are mounted on backplane 12 by inserting edge connectors 16 into slot connectors 18. Pins on edge connectors 16, such as pin 20, are electrically connected to interconnect traces (interconnects) 22 on backplane 12 via slot connectors 18. Interconnects 22 provide communication pathways for data and control signals between boards 14.

Test bus 24 is connected between connectors 18. Boundary scan testing may be performed by a central processing unit (CPU) in tester 26 connected to test bus 24 with connector 28 or may be performed by a CPU in master bus controller 30 on one of boards 14. Boards 14 each have a slave interface 32 driven by tester 26 or bus master 30. Boundary scan test data is loaded into a scan chain that passes serially through each of the components 34 on a given board. To load a test vector into the boundary scan cells in the scan chain on a particular board, the slave 32 for that board is addressed using protocols communicated in test bus 24. Test vector data is then loaded via test bus 24. Preferably, system 10 supports the Test Access Port (TAP) and Boundary Scan Architecture defined in IEEE Std. 1149.1.

A synchronization problem associated with boundary scan backplane testing is illustrated in FIG. 2. If each of boards 1–4 has the test vector pattern shown on the left side of FIG. 2 (current vector) and it is desired to apply the test vector patterns for each board shown on the right side of FIG. 2 (next vector), the boards must be updated one at a time. For example, the pattern 010001 for board 1 in the current vector can be updated with the pattern 110011 (update board 1) by addressing board 1. Board 2 can then be addressed, so that the pattern 111100 for board 2 in the current vector can be updated with the pattern 001100 (update board 3). Board 3 can then be addressed, so that the pattern 1100110 in the current vector can be updated with the pattern 001010 (update board 3). Finally, board 4 can be addressed, replacing the pattern 000011 for board 4 in the current vector with the pattern 110011. After updating board 4, the desired vector (next vector) has been obtained. However, the intermediate vectors between the current vector and the next vector may create contentions, whereby components on different boards simultaneously attempt to drive the same interconnect on the backplane. It could therefore damage the system if the intermediate vectors shown in FIG. 2 were to be applied.

In accordance with the present invention, a group of primitive vectors (disable, enable 0, and enable 1 vectors) are precomputed prior to testing for each board 14. The enable 0 and enable 1 vectors allow drivers in system 10 to be individually toggled. Individual drivers on a board 14 are toggled while the circuitry on other boards 14 is disabled, which avoids contention between drivers.

Further, because the vectors are precomputed, it is not necessary to process boundary scan description language and hierarchical description language files defining the board level characteristics of the boundary scan cells before testing. The precomputed primitives also simplify the process of managing dynamically reconfigurable boards 14, because the primitive vectors for boards 14 do not depend on the locations of boards 14 in backplane 12. Primitive vectors are provided to a given board 14 by addressing the appropriate slave interface 32. The capability to individually toggle the drivers of system 10 improves the fault detection and classification capabilities of system 10.

The drivers ($d_i$) in system 10 are portions of components 34 that drive pins on edge connectors 16, such as pin 20. The receivers ($r_i$) are portions of components 34 that receive the signals generated by drivers $d_i$. Drivers $d_i$ are connected to receivers $r_i$ by interconnects 22. For example, in FIG. 3, driver $d_1$ is connected to receiver $r_2$ via interconnect 36. In a system with sufficient boundary scan cells, all drivers $d_i$ are controllable and all receivers $r_i$ are observable.

Figure 3:
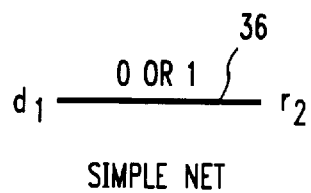
FIGS. 3–6 are interconnect network diagrams showing disable states.
Figure 4:
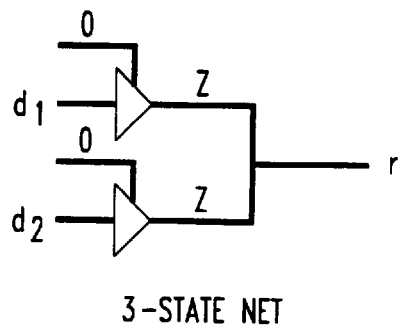
Figure 5:
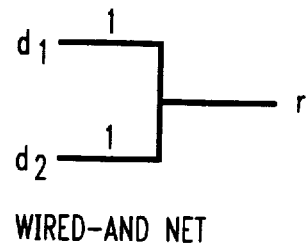
Figure 6:
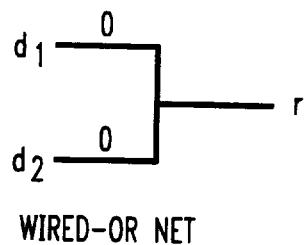

In order to perform boundary scan testing of backplane 12, each board 14 that does not contain the driver being toggled is temporarily disabled by applying a disable vector to its scan chain. FIGS. 3–6 are network representations of the disable states of various interconnect structures. In the simple net interconnect structure of FIG. 3, an output signal from driver $d_1$ is provided directly to receiver $r_2$. In the wired-AND network structure of FIG. 5, the path between drivers $d_1$ (e.g., on a first board 14) and $d_2$ (e.g., on a second board 14) and receiver r (e.g., on a third board 14) subjects the signals from $d_1$ and $d_2$ to a logical AND function. For the disable state, the drivers of wired and simple nets are set to noncontrolling values: 0 for wired-OR nets as shown in FIG. 6, 1 for wired-AND nets as shown in FIG. 5, and either 0 or 1 for simple nets as shown in FIG. 3. Three-state drivers are deactivated (i.e., tri-stated or not driving), as indicated by the letter Z in FIG. 4. Bidirectional pins are configured as receivers. When boards 14 are disabled, toggling one of the drivers in system 10 by applying the enable 0 and enable 1 primitive vectors will not create a signal conflict on interconnects 22.

Figure 7:
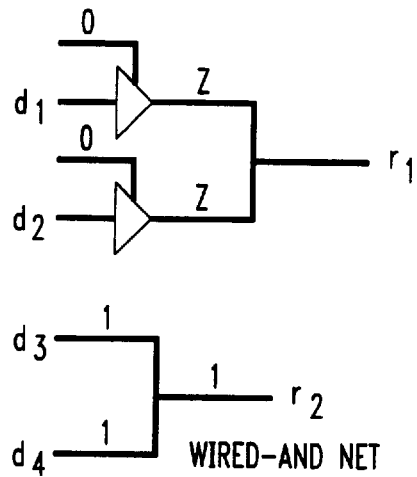
FIG. 7 is an interconnect network diagram of an illustrative interconnect network in the disable state.
Figure 8:
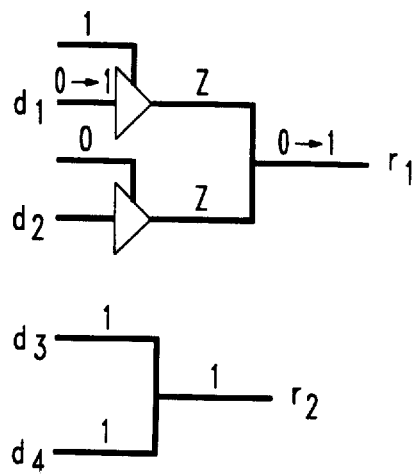
FIG. 8 is an interconnect network diagram of the network of FIG. 7 showing the network response to the toggling of driver $d_1$.
Figure 9:
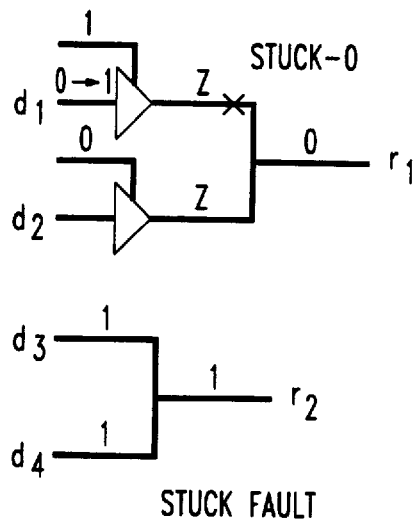
FIG. 9 is an interconnect network diagram of the network of FIG. 7, but with a stuck fault, showing the response of the network to the toggling of driver $d_1$.
Figure 10:
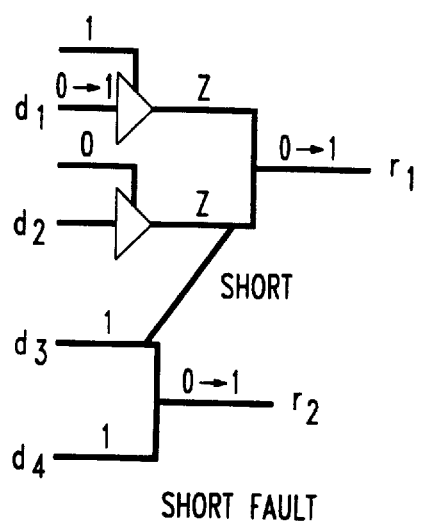
FIG. 10 is an interconnect network diagram of the network of FIG. 7, but with a short fault, showing the response of the network to the toggling of driver $d_1$.

The process of detecting backplane faults in system 10 by toggling a driver using the enable 0 and enable 1 vectors is illustrated in FIGS. 7–10. FIG. 7 shows a representative interconnect network 38 in the disable state, after the disable vector has been applied. After disabling network 38, network driver $d_1$ is toggled from 0 to 1 by applying appropriate enable 0 and enable 1 vectors. If there is no fault, receiver $r_1$ will toggle from 0 to 1, while receiver $r_2$ remains unchanged, as shown in FIG. 8. In the presence of a stuck fault in the three-state network portion of network 38, the signal observed at receiver $r_1$ will remain unchanged, as shown in FIG. 9. In the presence of the short fault shown in FIG. 10, toggling $d_1$ will result in a 0 to 1 transition being observed at receiver $r_2$. If the AND net in FIG. 10 is stronger than the three-state net, the three-state net will be prevented from toggling, thereby allowing the fault (known as a stronger-driver fault) to be observed.

FIGS. 7–10 show possible faults detection scenarios when network 38 is disabled and driver $d_1$ is toggled. To test backplane 12, all boards 14 in system 10 are disabled. Each available driver $d_i$ is then toggled in succession while the resulting signals at all available receivers $r_i$ are observed. Preferably, all drivers on a circuit board are toggled before proceeding to the next board. This testing technique is known as a walking enable.

Various data structures may be used to define the configuration of system 10 prior to performing a walking enable test. Preferably, a slot list is used to specify the location at which boards 14 are inserted into backplane 12. This is the only required data that depends on the configuration of boards 14 in backplane 12. A backplane interconnect list is preferably used to specify the pattern of interconnect traces on backplane 12. For example, the backplane interconnect list can contain data identifying the pins in slot connectors 18 by pin number and specifying the network properties of the associated interconnects 22 on backplane 12.

Another data structure that may be used is a board pin map, which for each pin of a board 14 (such as pin 20), provides information concerning the associated boundary scan cells and pins of slot connectors 18 (such as pin 40). Pin types include bidirectional (B), input (I), output2 (O2), and output3 (O3). The associated boundary scan cell can be a three-state control (C), input (I), or output (O) cell. The format for an entry could be (pin type, slot pin number, (cell number, . . . )). For example, ((B, 5), (C,3), (O,7), (I,9)) specifies a bidirectional pin connected to slot pin number 5 and associated with a three-state control cell number 3 (also a direction control cell), an output cell 7, and an input cell 9.

In addition to the board pin map, the disable, enable 0, and enable 1 primitive vectors must be precomputed for each board 14. The precomputed primitive vectors are then stored for later use (e.g., when testing system 10 in the field). Although the locations of boards 14 within backplane 12 vary from system to system, the values of the precomputed primitive vectors are independent of the final configuration of boards 14. Accordingly, the primitive vectors can be precomputed without needing to anticipate where a board 14 is ultimately to be located within the system. Further, it is only necessary to calculate the primitive vectors once for each board type (e.g., memory or input/output (I/O)), regardless of how many boards of that type are used in system 10. Precomputing and storing the primitive vectors simplifies the way in which the large volume of data associated with testing complex systems is handled, because it is not necessary to process the boundary scan description language files and board scan chain configuration data prior to each test.

Figure 11:
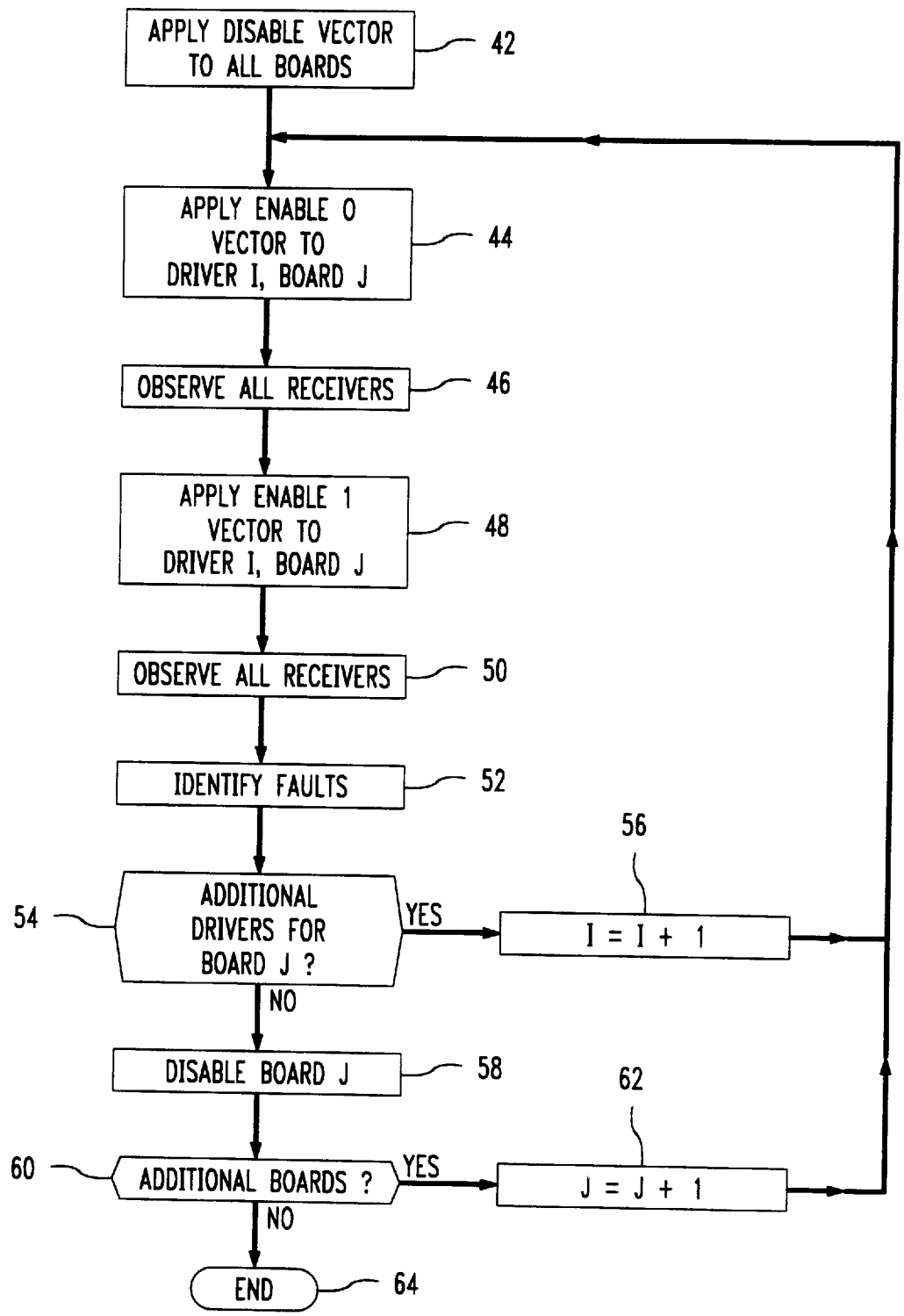
FIG. 11 is a flow chart of the steps involved in the walking enable testing technique.

The steps involved in performing a walking enable test are shown in FIG. 11. At step 42, disable vectors are applied to each board 14 in system 10. After boards 14 have been disabled, an enable 0 vector is applied for driver I on board J at step 44. The values of I and J are initialized at 1. At step 46, the scan chain cell values are read out for all receivers on all boards 14 in system 10. An enable 1 vector is applied for driver I on board J at step 48. At step 50, the scan chains cell values are once again read out for all receivers on all boards 14.

Because steps 44, 46, 48, and 50 toggle driver I while all receivers are observed, backplane faults can be identified at step 52. In general, the walking enable technique will identify faults as falling into one of two classes depending on the response of the receivers to the toggling of a particular driver: (1) when receivers are expected to change states, but do not, the fault is an open, stuck-at, or stronger-driver symmetric short, and (2) when receivers change states, but unexpected additional receivers also change their states, the fault is an asymmetric or symmetric short other than a stronger-driver short.

At step 54, it is determined whether additional drivers are to be toggled for board J. If additional drivers are to be toggled, the driver number, I, is incremented at step 56 and control is returned to step 44. If additional drivers are not to be toggled, board J is disabled at step 58. At step 60 it is determined whether boards remain that have not had their drivers toggled. If drivers on additional boards are to be toggled, the board number, J, is incremented at step 62 and control is returned to step 44. If no additional boards remain with drivers to be toggled, the walking enable process is terminated at step 64.

Figure 12:
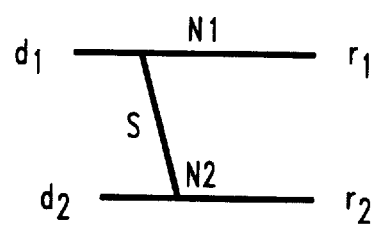
FIG. 12 is a network diagram illustrating the detection of a short fault.

The walking enable of FIG. 11 allows faults to be identified in a comprehensive fashion, although not every possible test vector is applied to the interconnect networks in system 10. The walking enable will detect all open faults and all stuck-at faults. Although it is theoretically possible for some shorts not to be detected by the vectors applied during the walking enable, in practice most short are also detected. For example, as shown in FIG. 12, interconnect networks N1 and N2 are connected by short S. Four possible subvectors could be applied to drivers $d_1$ and $d_2$: (0,0), (0,1), (1,0), and (1,1). Using the primitive enable 0 and enable 1 vectors for drivers $d_1$ and $d_2$ ensures that subvectors (0,1), and (1,0) will be applied to $d_1$ and $d_2$, but does not guarantee that vectors (0,0) and (1,1) will be applied. As a result, if short S has characteristics that would only be detected upon application of the (0,0), or (1,1) subvectors, short S may remain undetected by the walking enable vectors. However, in practice the (0,0) and (1,1) subvectors are relatively unimportant. The (0,1) and (1,0) subvectors are able to detect most faults, such as short S.

Figure 13:
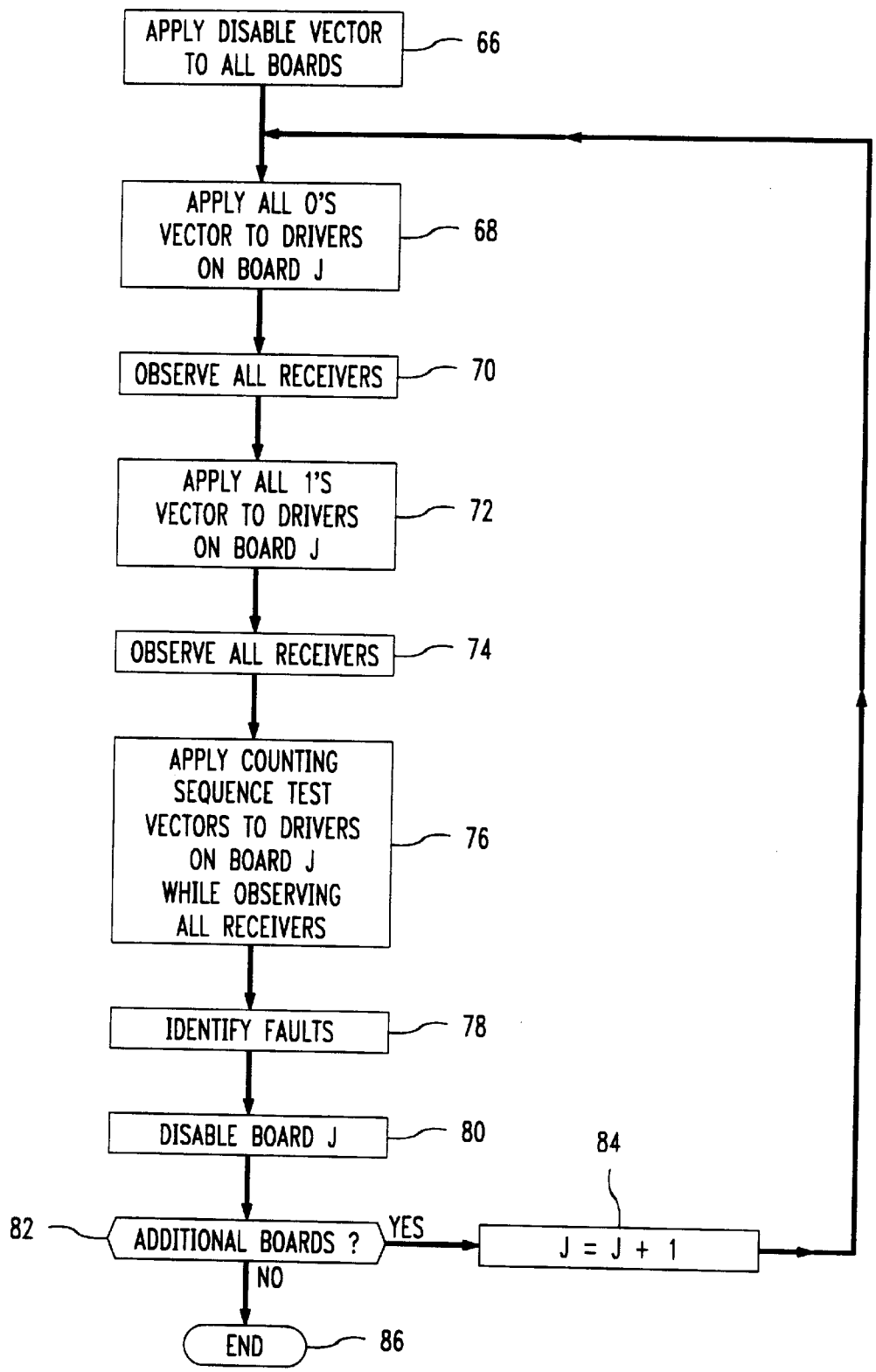
FIG. 13 is a flow chart of the steps involved in the intraboard counting testing technique.

Although the walking enable technique is comprehensive, it may sometimes be desirable to test backplane 12 with fewer vectors, thereby reducing the time required to complete the test. A backplane testing technique similar to the walking enable, but which uses fewer test vectors and is therefore faster, is the intraboard counting technique. The steps involved in backplane testing using the intraboard counting technique are shown in FIG. 13. At step 66, disable vectors are applied to each board 14 in system 10. After boards 14 have been disabled, a vector containing only 0's (i.e., (0,0, . . . 0)) is applied to board J at step 68. The value of J is initialized at 1. At step 70, the scan chain cell values are read out for all receivers on all boards 14 in system 10. A vector containing only 1's (i.e., (1,1, . . . 1)) is applied to board J at step 72. At step 74, the scan chain cell values are read out for all receivers on all boards 14.

At step 76, a series of counting sequence test vectors are applied to the scan chain in board J, while the resulting signals are observed on all boards. The counting sequence test vectors are not as comprehensive as the enable 0 and enable 1 primitive vectors used in the walking enable technique. Nevertheless, the counting sequence vectors provide adequate test coverage for many purposes. The counting sequence vectors are derived by counting drivers in a binary fashion. For example, if there are four drivers in the sequence, the binary count sequence is (0,0), (0,1), (1,0), and (1,1). There will therefore be two test vectors $v_1$ and $v_2$, as shown in Table 1.

TABLE 1

|  | $d_1$ | $d_2$ | $d_3$ | $d_4$ |
| --- | --- | --- | --- | --- |
| Test vector $v_1$: | 0 | 1 | 0 | 1 |
| Test vector $v_2$: | 0 | 0 | 1 | 1 |

Applying the counting sequence test vectors in step 76 while observing all of the receivers allows backplane faults to be identified at step 78. The intraboard counting technique will identify faults as falling into one of two classes depending on the response of the receivers: (1) when receivers are expected to change states, but do not, the fault is an open, stuck-at, or stronger-driver symmetric short, and (2) when receivers change states, but unexpected additional receivers also change their state, the fault is an asymmetric or symmetric short other than a stronger-driver symmetric short.

Board J is disabled at step 80. At step 82 it is determined whether boards remain that have not had their drivers exercised by the all 0's, all 1's, and binary counting sequence test vectors. If drivers on additional boards are to be exercised, the board number, J, is incremented at step 84 and control is returned to step 68. If no additional boards with drivers to be exercised remain, the intraboard counting process is terminated at step 86.

Although the intraboard counting technique of FIG. 13 is less comprehensive in detecting faults than the walking enable technique of FIG. 11 (e.g., fewer asymmetric faults are detected with intraboard counting), the intraboard counting technique allows tests to be completed more quickly. If n is the total number of drivers and m is the summation of all board scan chain lengths, the time to complete a walking enable backplane test is proportional to mn. If k is the average number of drivers per board 14 and s is the number of boards 14, the time to complete a intraboard counting backplane test is proportional to ms log(k).

The walking enable and intraboard counting techniques are both satisfactory techniques for generating test vectors. If desired, other techniques for providing test vectors to circuit boards 14 can be used, provided that test vectors are applied to drivers on a single board at a time while the remaining boards in the system are disabled and provided that the signals on all receivers in the system are monitored simultaneously.

The foregoing is merely illustrative of the principles of this invention and various modifications can be made by those skilled in the art without departing from the scope and spirit of the invention.

What is claimed is:

1. A method for boundary scan testing a system backplane in a system for faults, the system having a plurality of circuit boards mounted on the backplane in a multidrop configuration, the backplane having a plurality of interconnects, each circuit board having a plurality of drivers connected to the interconnects for providing output signals, a plurality of receivers connected to the interconnects for receiving the output signals provided by the drivers, a chain of boundary scan cells connected to the drivers and receivers, and a slave interface connected to the interconnects and the chain of boundary scan cells on that board, the method comprising the steps of:

(a) providing a disable vector to the slave interfaces of each board, the slave interfaces passing the disable vector to the boundary scan cells of each board so as to disable the drivers of each board;

(b) providing a plurality of test vectors to a given one of the circuit boards using the slave interface of that board to pass the test vectors to the boundary scan cells on that board, the boundary scan cells on that board providing the test vectors to the drivers on that board;

(c) using the boundary scan cells on all of the circuit boards to observe the signals on the interconnects received by the receivers in response to the test vectors provided to that given one of the circuit boards, the boundary scan cells passing the observed signals to the slave interfaces;

(d) identifying faults on said backplane based on the test vectors and the observed signals;

(e) disabling the board to which the test vectors were provided in step (b) by providing a disable vector to slave interface of that board, the slave interface on that board passing the disable vector to the boundary scan cells on that board so as to disable the drivers of that board; and (f) repeating steps (b), (c), (d), and (e) for each board.

2. The method defined in claim 1, wherein the step of providing the plurality of test vectors comprises the step of providing precomputed test vectors.

3. The method defined in claim 2, wherein the step of providing the plurality of test vectors comprises the steps of:

providing a plurality of precomputed enable 0 test vectors; and providing a plurality of precomputed enable 1 test vectors.

4. The method as defined in claim 3, wherein the steps of providing the enable 0 and enable 1 test vectors and using the boundary scan cells on all of the boards to observe the signals received by the receivers comprise the steps of:

first providing one of the precomputed enable 0 test vectors to the given one of the circuit boards;

second observing the signals on the interconnects at all of their receivers using the boundary scan cells on all of the boards;

third providing one of the precomputed enable 1 test vectors corresponding to said one of the precomputed enable 0 test vectors to the given one of the circuit boards; and fourth observing the signals on the interconnects at all of the receivers using the boundary scan cells on all of the boards.

5. The method defined in claim 1, wherein the step of providing the plurality of test vectors comprises the steps of:

providing an all 0's test vector;

providing an all 1's test vector; and providing a series of binary counting sequence test vectors.

6. The method defined in claim 1, wherein the step of identifying faults comprises the step of classifying faults in a first class of faults including open faults, stuck-at faults, and stronger-driver symmetric shorts, and a second class of faults including shorts other than stronger driver symmetric shorts.

7. The method defined in claim 1, wherein the step of providing the test vectors comprises the step of:

using a test bus to provide the test vectors to a given one of the circuit boards using the slave interface on that board.

* * * * *